United States Patent
Ouyang

(10) Patent No.: US 7,245,495 B2
(45) Date of Patent: Jul. 17, 2007

(54) FEEDBACK CONTROLLED MAGNETO-HYDRODYNAMIC HEAT SINK

(75) Inventor: Chien Ouyang, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/313,388

(22) Filed: Dec. 21, 2005

(65) Prior Publication Data

US 2007/0139889 A1 Jun. 21, 2007

(51) Int. Cl.
*H05K 7/20* (2006.01)

(52) U.S. Cl. .................. 361/701; 361/699; 361/703; 361/718; 165/80.4; 165/80.5; 165/104.33

(58) Field of Classification Search ........... 361/697, 361/699–703, 709–710, 718–719; 165/80.3–80.5, 165/104.33, 185; 257/713–714, 719, 721–722
See application file for complete search history.

(56) References Cited

U.S. PATENT DOCUMENTS

| | | | |
|---|---|---|---|
| 5,355,942 A | 10/1994 | Conte | |
| 5,815,370 A * | 9/1998 | Sutton | 361/699 |
| 6,648,064 B1 * | 11/2003 | Hanson | 165/120 |
| 6,708,501 B1 * | 3/2004 | Ghoshal et al. | 62/3.7 |
| 6,763,880 B1 * | 7/2004 | Shih | 165/80.4 |
| 6,942,018 B2 * | 9/2005 | Goodson et al. | 165/80.4 |
| 7,104,313 B2 * | 9/2006 | Pokharna et al. | 165/80.4 |
| 7,131,286 B2 * | 11/2006 | Ghoshal et al. | 62/259.2 |
| 2005/0160752 A1 * | 7/2005 | Ghoshal et al. | 62/259.2 |
| 2005/0280994 A1 * | 12/2005 | Yazawa | 361/699 |
| 2006/0196642 A1 * | 9/2006 | Gharib et al. | 165/104.28 |

\* cited by examiner

*Primary Examiner*—Michael Datskovsky
*Assistant Examiner*—Robert J. Hoffberg
(74) *Attorney, Agent, or Firm*—Osha Liang LLP

(57) ABSTRACT

A heat sink operatively connected to an integrated circuit is configured to generate a magnetic field. Fluid flow toward and away from a hot spot of the integrated circuit is dependent on the magnetic field and an induced electrical current. A temperature sensor is used to take temperature measurements of the hot spot. A value of the induced electrical current is adjusted dependent on one or more temperature measurements taken by the temperature sensor.

17 Claims, 10 Drawing Sheets

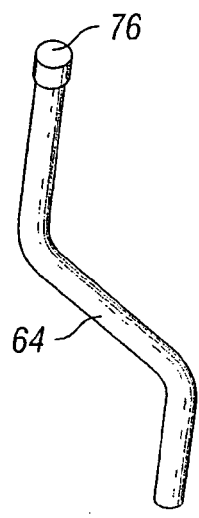
FIG. 9
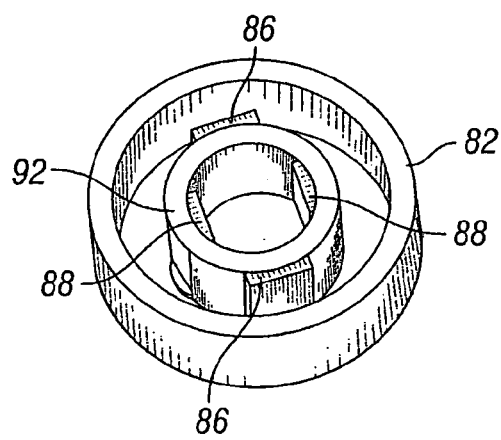 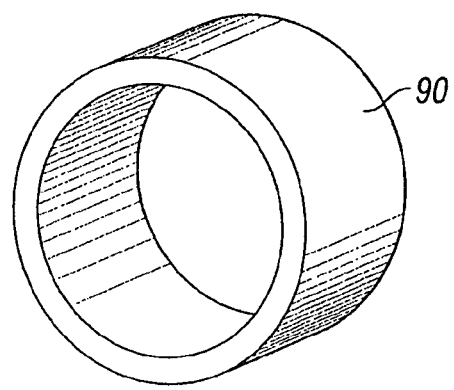
FIG. 10A  FIG. 10B

FEEDBACK CONTROLLED MAGNETO-HYDRODYNAMIC HEAT SINK

BACKGROUND

A computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media (e.g., a floppy disk or a CD-ROM (not shown)). The computing portion 12, using memory and other internal components, processes both internal data and data provided to the computing portion 12 by the user to generate data requested by the user. The generated data may be provided to the user via, for example, a display device 18 or a printer 20. The computing portion 12 of a computer system typically includes various components such as, for example, a power supply, disk drives, and the electrical circuitry required to perform the necessary and requested operations of the computer system.

As shown in FIG. 2, the computing portion 12 may contain a plurality of circuit boards 22, 24, 26, 28 (e.g., printed circuit boards (PCBs) or printed wiring boards (PWBs)) on which various circuit components are implemented. For example, a computing portion designed to have enhanced sound reproducing capabilities may have a circuit board dedicated to implementing circuitry that specifically operate to process data associated with the reproduction of sound.

In FIG. 2, the components of exemplary circuit board 22 are shown. A crystal oscillator 30 provides a reference of time to various integrated circuits (ICs) 32, 34, 36, 38, 40, 42 (e.g., application specific integrated circuits (ASICs), field-programmable gate arrays (FPGAs), microprocessors, logic gates) that are connected to the circuit board 22. The integrated circuits 32, 34, 36, 38, 40, 42 communicate with one another, i.e., pass data, using wires or traces of conductive material (e.g., copper (shown, but not labeled)) embedded in the circuit board 22.

In operation, an integrated circuit, such as those shown in FIG. 2, dissipates heat as a result of work performed by the integrated circuit. Energy that is needed by the integrated circuit for work is not consumed with 100% efficiency, thereby resulting in excess energy that is released, among other things, as heat. As integrated circuits become more dense (i.e., more transistors per unit area) and faster (i.e., higher operating frequencies), they generate more heat. As excessive heat is damaging to an integrated circuit both in terms of performance and component integrity, an important design consideration involves ensuring that heat dissipated by an integrated circuit is sufficiently drawn away from the integrated circuit, where the efficiency of drawing away heat from the integrated circuit is expressed in terms of what is referred to as the "heat transfer rate."

"Heat sinks" are devices that are commonly used to cool integrated circuits. FIG. 3 shows a heat sink 50 as used with an integrated circuit 52 housed in a package 54 atop a substrate 56. The heat sink 50 is made of a high thermal conductivity metal (e.g., copper or aluminum). A "high thermal conductivity metal" is one that allows heat to pass through it because it contains many free electrons.

A base of the heat sink 50 is secured over the integrated circuit 52 by, for example, a retention clip (not shown) or an adhesive or thermal interface material (shown, but not labeled). During operation of the integrated circuit 52, the temperature of the integrated circuit 52 increases due to increased particle movement resulting from a build-up of excess energy. The increased integrated circuit temperature results in an increase in the temperature of the package 54, and consequently, of the heat sink 50. The increased temperature of the heat sink 50 results in an increase in the temperature of the air around the heat sink 50, whereby the heated air rises and effectively draws heat away from the integrated circuit 52. This process is referred to as "convection."

The removal of heat dissipated from an integrated circuit by a heat sink is dependent on numerous factors. For example, the thermal resistance of the package that houses the integrated circuit affects how much heat transfers from the integrated circuit to the heat sink. Also, the effectiveness of the adhesives between the integrated circuit and its package and the package and the heat sink affects how much heat transfers between these components. Moreover, the conductivity of the materials used in the package and the heat sink has a direct bearing on the amount of heat that is transferred away from the integrated circuit. The surface area of the heat sink is also important as more surface area results in more air being heated, thereby resulting in more heat being drawn away from the integrated circuit by the rising heated air.

SUMMARY

According to one aspect of one or more embodiments of the present invention, a computer system comprises: an integrated circuit; a lid disposed over the integrated circuit; a temperature sensor disposed on the lid and arranged to measure a temperature of a hot spot of the integrated circuit; and a heat sink operatively connected to the lid, where the heat sink includes (i) a pipe operatively connected to the temperature sensor and (ii) a pump assembly operatively connected to the pipe and arranged to generate a magnetic field, where fluid flow within the pipe is dependent on the magnetic field and the temperature sensor.

According to another aspect of one or more embodiments of the present invention, a method of cooling an hot spot of an integrated circuit comprises: generating a magnetic field; inducing an electrical current through the magnetic field; propagating electrically and thermally conductive fluid toward the hot spot and away from the hot spot dependent on the magnetic field and the electrical current; measuring a temperature of the hot spot; and adjusting the electrical current dependent on the measuring.

According to another aspect of one or more embodiments of the present invention, a heat sink comprises: a body having a plurality of fins configured to dissipate heat; a pipe extending through the body and arranged to propagate electrically and thermally conductive fluid, where the pipe is further adapted to cool a hot spot of an integrated circuit; and a pump assembly operatively connected to the pipe and arranged to generate a magnetic field and an electrical current, where fluid flow within the pipe is dependent on the magnetic field and a temperature of the hot spot.

Other aspects and advantages of the invention will be apparent from the following description and the appended claims.

BRIEF DESCRIPTION OF DRAWINGS

FIG. 9 shows a portion of a heat sink in accordance with an embodiment of the present invention.

FIG. 10A shows a portion of a heat sink in accordance with an embodiment of the present invention.

FIG. 10B shows a portion of a heat sink in accordance with an embodiment of the present invention.

DETAILED DESCRIPTION

Figure 1:
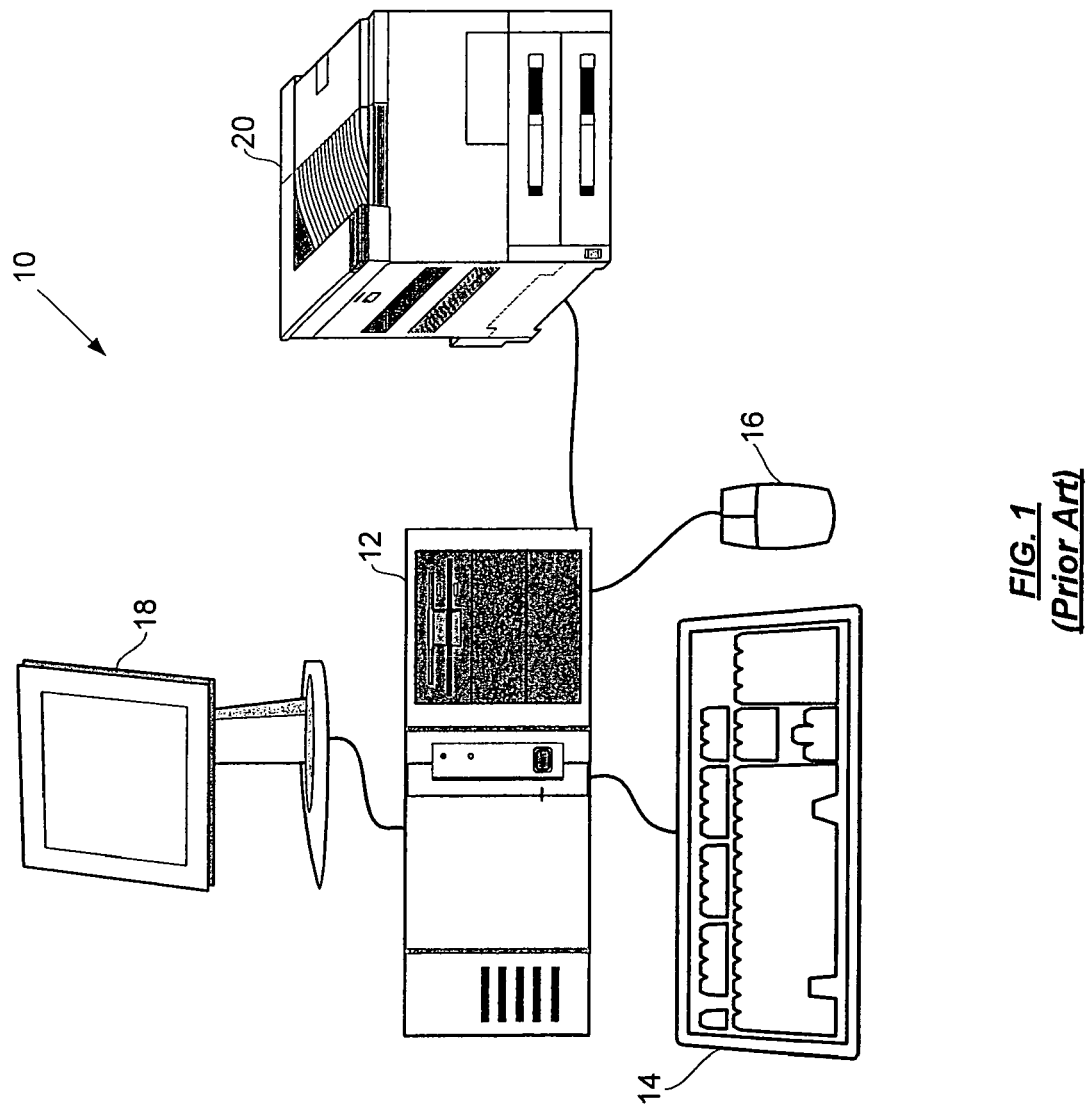
FIG. 1 shows a computer system.
Figure 2:
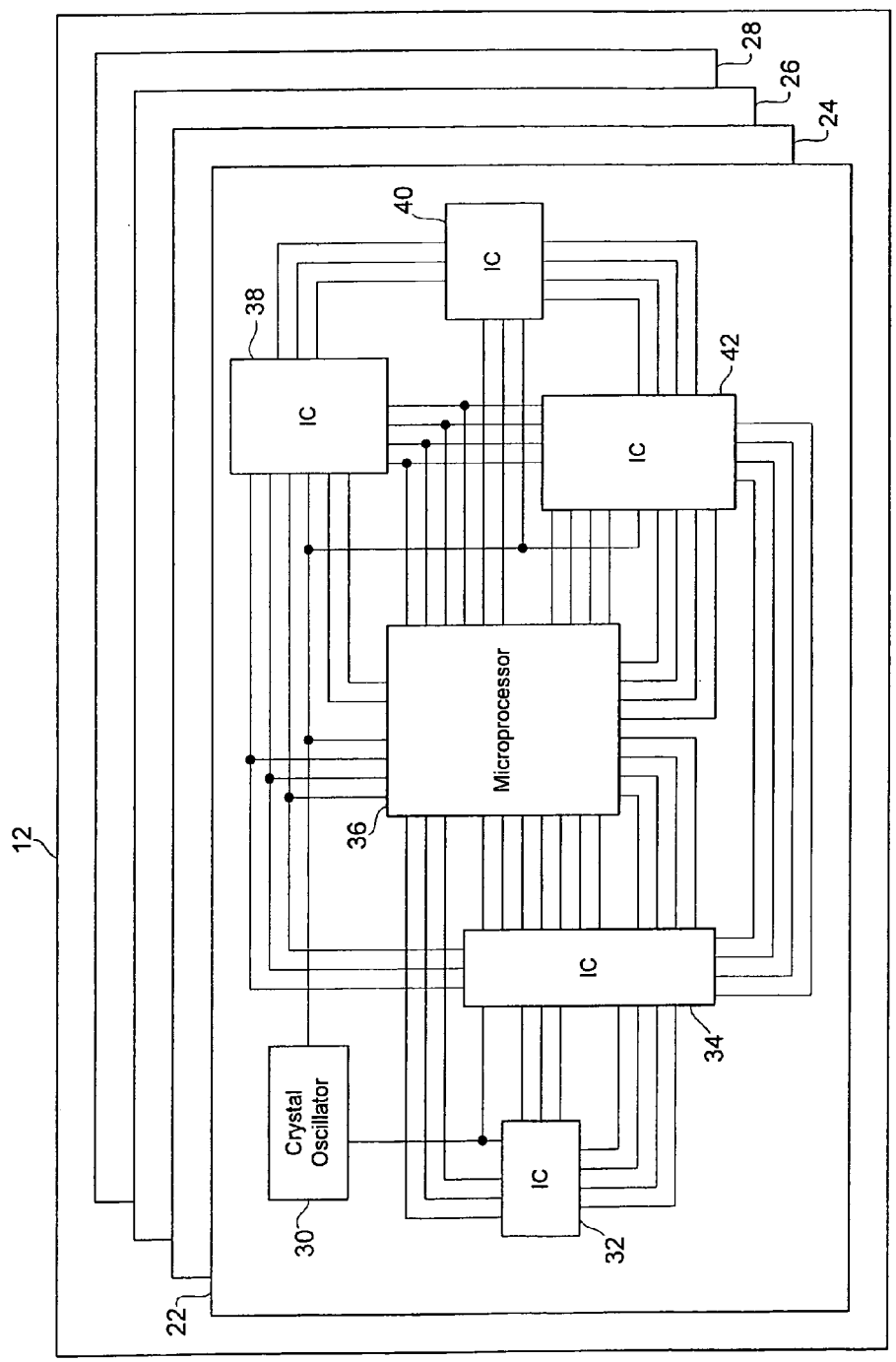
FIG. 2 shows a portion of a computer system.
Figure 3:
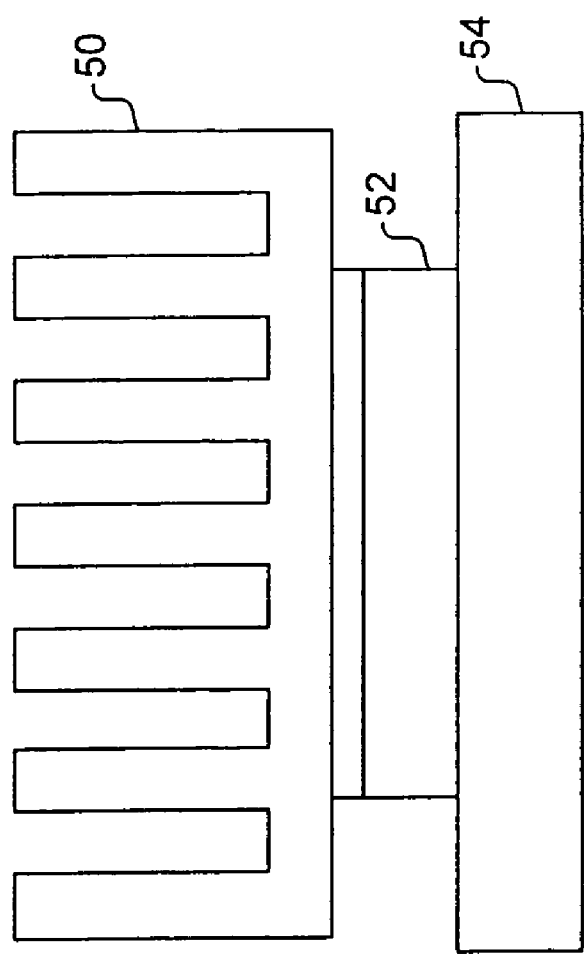
FIG. 3 shows a heat sink as used with an integrated circuit.

As described above, a heat sink is used to transfer heat away from a heat source, such as an integrated circuit. A typical heat sink is designed to uniformly transfer heat away from an integrated circuit (i.e., a typical heat sink is arranged to cool down an integrated circuit across an entire area of the integrated circuit). However, during operation of an integrated circuit, a temperature at one region of the integrated circuit may differ from a temperature at another region of the integrated circuit. In other words, the various regions of an integrated circuit do not necessarily have the same operating temperature. Instead, some regions, herein individually referred to as a "hot spot," operate at temperatures higher than other regions. Such differences in temperature across an integrated circuit result from higher power consumption at certain regions of the integrated circuit. For example, a region of the integrated circuit that drives a frequently switching signal likely consumes more power than a region of the integrated circuit that drives a constant signal.

While typical heat sinks are designed to uniformly cool across an integrated circuit as described above, embodiments of the present invention relate to a heat sink that is designed to specifically cool one or more hot spots of an integrated circuit. Generally, in one or more embodiments of the present invention, such a heat sink uses one or more pipes that carry fluid with a flow dependent on a magnetic field. Such a pipe is herein referred to as a "magneto-hydrodynamic" pipe.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the invention. In other instances, well-known features have not been described in detail to avoid obscuring the description of embodiments of the present invention.

Figure 4:
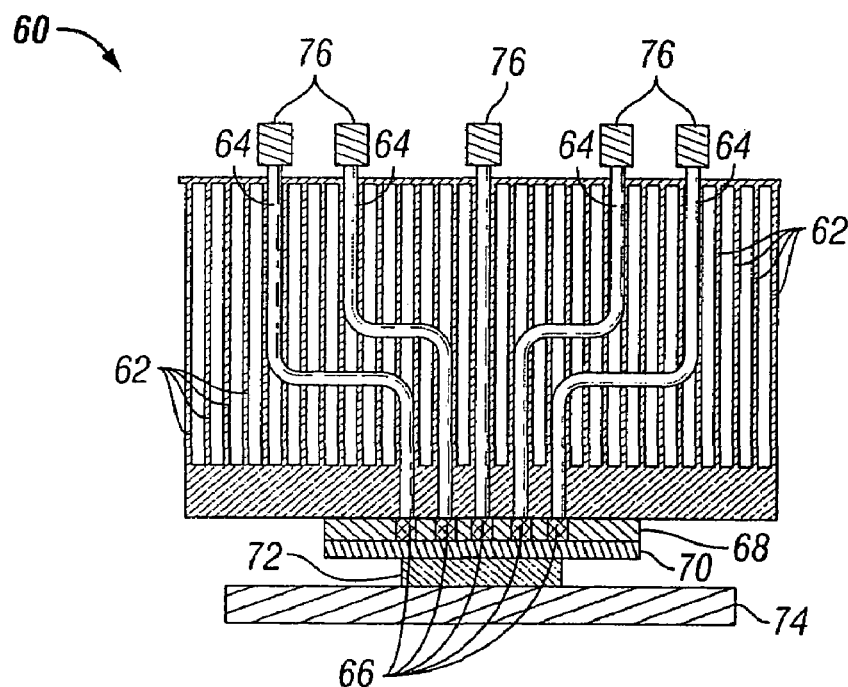
FIG. 4 shows a heat sink in accordance with an embodiment of the present invention.

FIG. 4 shows an example of a heat sink 60 in accordance with an embodiment of the present invention. The heat sink 60 has a plurality of "fins" 62 allowing for and facilitating the dissipation of heat away from the heat sink 60. A plurality of magneto-hydrodynamic pipes 64 are also provided with the heat sink 60. Those skilled in the art will note that in one or more embodiments of the present invention, the magneto-hydrodynamic pipes 64 may be integral with a body of the heat sink 60.

One end of each of the magneto-hydrodynamic pipes 64 is associated with a temperature sensor 66 embedded in a thermal interface material 68 disposed on a lid 70 positioned over an integrated circuit 72 and substrate 74. One another end of each of the magneto-hydrodynamic pipes 64 is a pump assembly 76 that is further described below with reference to FIGS. 10A, 10B, 11A, 11B, and 11C.

Each temperature sensor 66 is configured to measure/sense a temperature at a particular location of the integrated circuit 72. Further, those skilled in the art will note that the sizing and arrangement of one or more of the temperature sensors 66, the thermal interface material 68, and the lid 70 may be adjusted so as to improve the accuracy of temperature measurements taken by one or more of the temperature sensors 66.

Figure 5A:
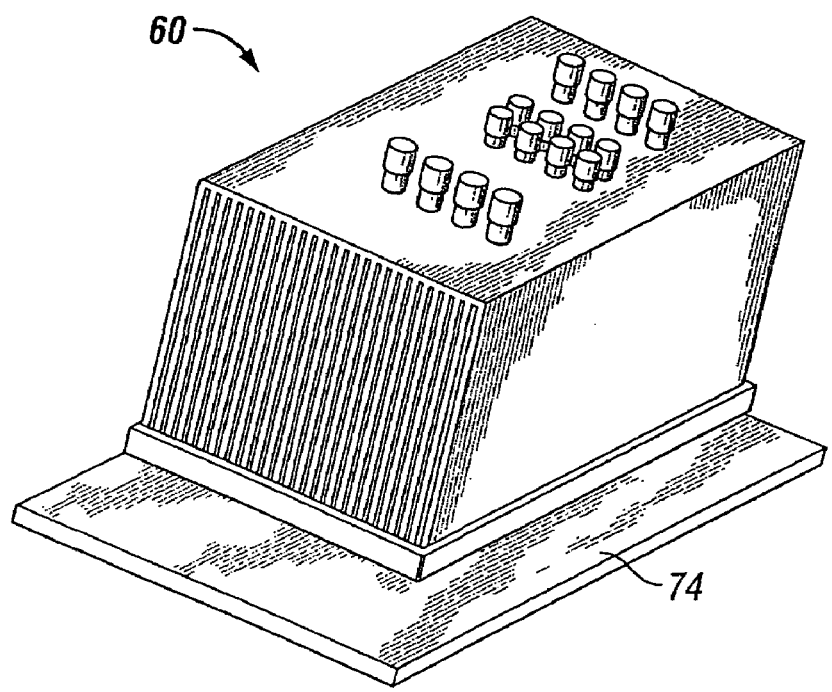
FIG. 5A shows a top-side view of a heat sink in accordance with an embodiment of the present invention.
Figure 5B:
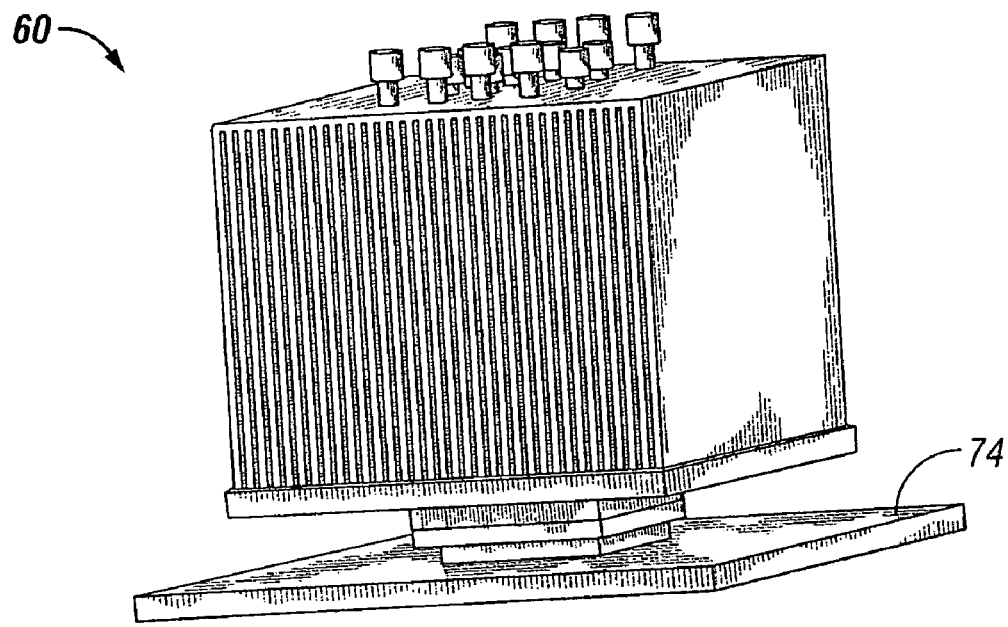
FIG. 5B shows a side view of a heat sink in accordance with an embodiment of the present invention.

FIGS. 5A and 5B show perspective views of heat sink 60 in accordance with one or more embodiments of the present invention. As shown in FIGS. 5A and 5B, pump assemblies 76 protrude from a body of the heat sink 60. Those skilled in the art will note that such an arrangement may result in the pump assemblies 76 to being subject to a lesser amount of heat than if the pump assemblies 76 were arranged within the body of the heat sink 60.

In one or more embodiments of the present invention, one or more of fins 62, magneto-hydrodynamic pipes 64, and lid 70 may be formed of a thermally conductive material. For example, one or more of fins 62, magneto-hydrodynamic pipes 64, and lid 70 may be formed of copper.

Further, in one or more embodiments of the present invention, a heat sink may have a different fin configuration than that shown in FIGS. 4, 5A, and 5B. Moreover, those skilled in the art will note that the heat sink 60 shown in FIGS. 4, 5A, and 5B is not necessarily to scale and is not limited to a particular length, width, and/or height.

Further, although the heat sink 60 shown in FIGS. 4, 5A, and 5B depict a certain number of magneto-hydrodynamic pipes 64, in one or more other embodiments of the present invention, a different number of magneto-hydrodynamic pipes may be used.

Figure 6A:
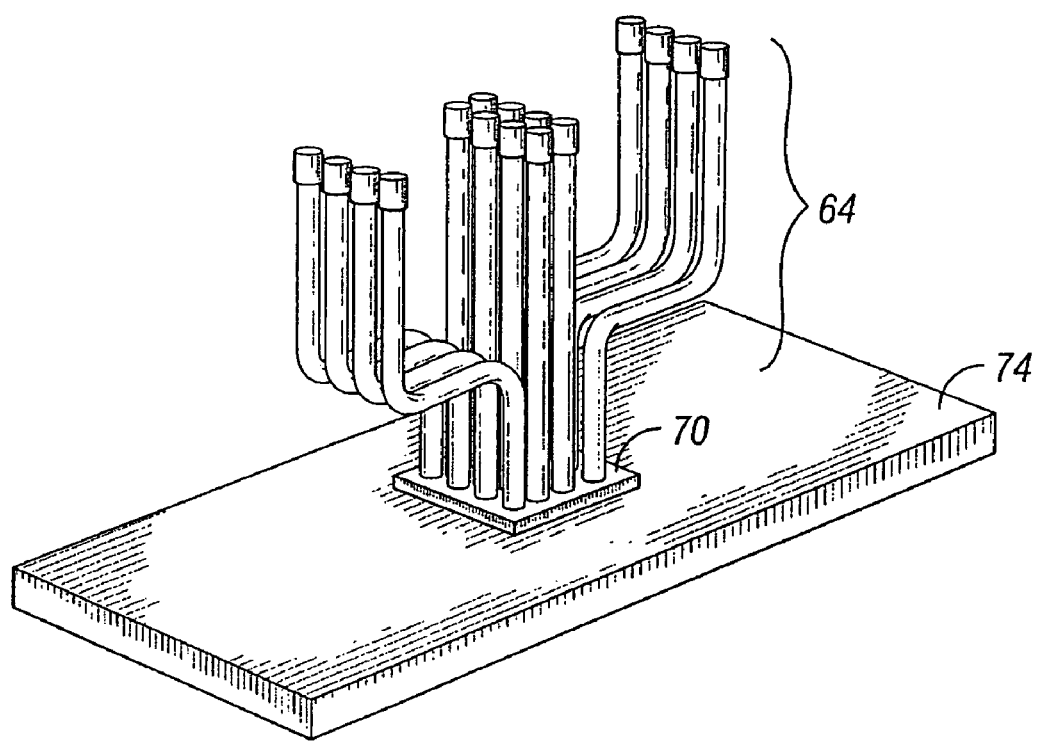
FIG. 6A shows a portion of a heat sink in accordance with an embodiment of the present invention.
Figure 6B:
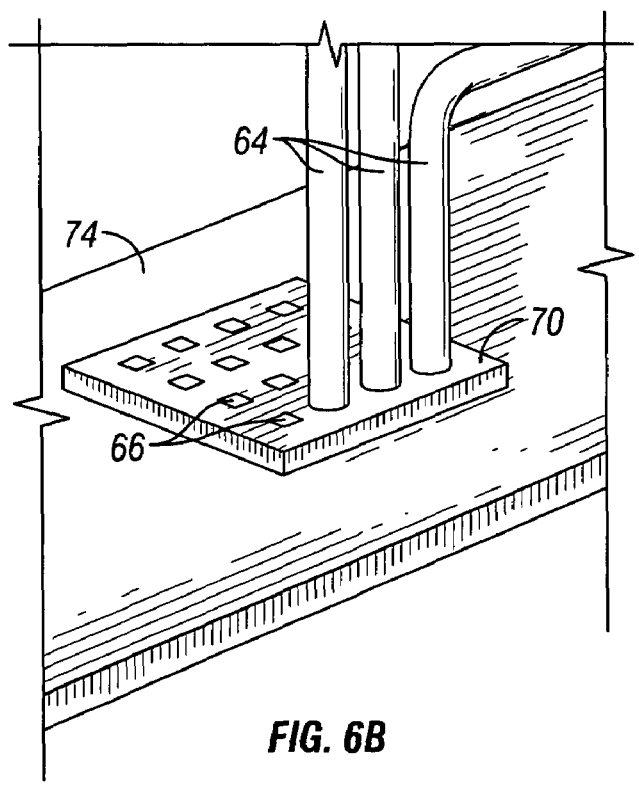
FIG. 6B shows a portion of a heat sink in accordance with an embodiment of the present invention.

FIGS. 6A and 6B show portions of heat sink 60 in accordance with one or more embodiments of the present invention. As shown in FIG. 6A, a plurality of magneto-hydrodynamic pipes 64 are arranged to each have an end operatively connected to lid 70. As shown in FIG. 6B, each such end of magneto-hydrodynamic pipes 64 rests atop, or is otherwise connected, to a corresponding temperature sensor (shown, but not labeled). Those skilled in the art will note that an integrated circuit (not shown in FIGS. 6A and 6B) is disposed underneath the lid 70, and each temperature sensor (shown, but not labeled) is arranged to measure/sense a temperature at a particular location of the integrated circuit.

Figure 7A:
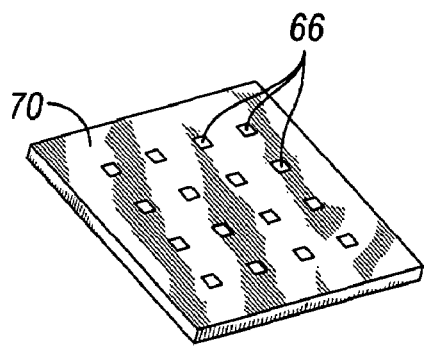
FIG. 7A shows a portion of a heat sink in accordance with an embodiment of the present invention.
Figure 7B:
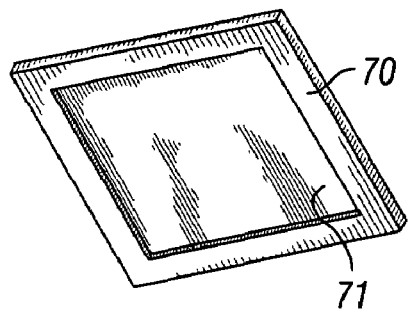
FIG. 7B shows a portion of a heat sink in accordance with an embodiment of the present invention.

FIGS. 7A and 7B shows top and bottom side view of lid 70 in accordance with one or more embodiments of the present invention. FIG. 7A shows a plurality of temperature sensors 66 arranged along a top side of the lid 70. Those skilled in the art will note although FIG. 7A shows sixteen temperature sensors 66 arranged in a grid-like pattern, in one or more other embodiments of the present invention, any number and/or arrangement of temperature sensors may be arranged on any surface of the lid 70.

FIG. 7B shows a bottom side of the lid 70. Particularly, FIG. 7B shows that a recess 71, or other cavity, may be formed in the lid 70 so as to at least partially house or accommodate an integrated circuit. However, in one or more other embodiments of the present invention, a bottom side of the lid 70 may be planar without a recess or cavity to at least partially house or accommodate an integrated circuit. In such embodiments, a top aside of integrated circuit may be operatively connected to the planar bottom side of the lid 70.

Figure 8B:
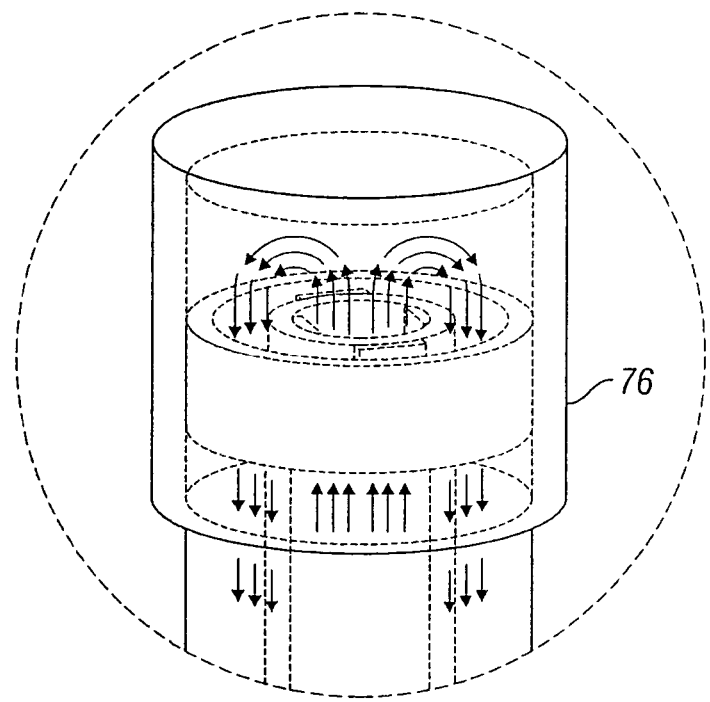
FIG. 8A–8C shows a portion of a heat sink in accordance with an embodiment of the present invention.
Figure 8C:
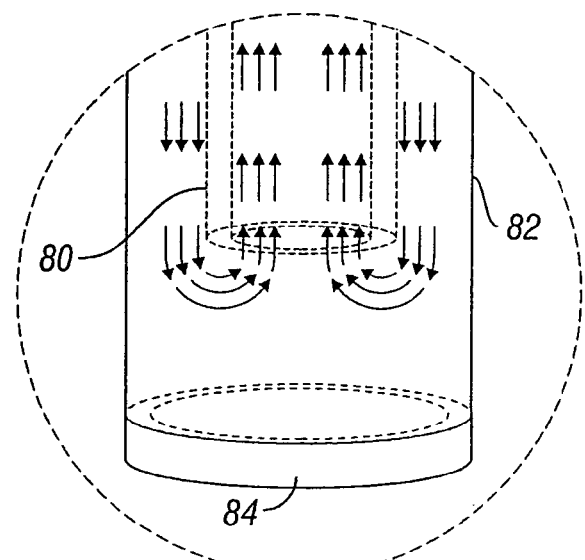
Figure 8A:
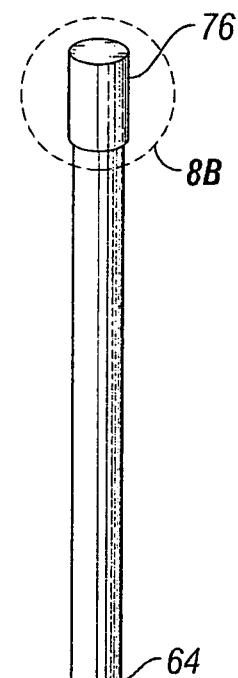

FIGS. 8A–8C show an example of a magneto-hydrodynamic pipe 64 in accordance with an embodiment of the present invention. The magneto-hydrodynamic pipe 64 is formed of two concentric pipes 80, 82, as shown in FIG. 8C. One end of the magneto-hydrodynamic pipe 64 is housed in pump assembly 76 for controlling the direction of fluid flow in pipes 80, 82. As discernible from FIGS. 8A–8C, in one or more embodiments of the present invention, pump assembly 76 may be disposed on the end of the magneto-hydrodynamic pipe 64 that is not disposed over a hot spot of an integrated circuit. Further, in one or more other embodiments of the present invention, the magneto-hydrodynamic pipe 64 may be configured differently than that shown in FIG. 8A. For example, the magneto-hydrodynamic pipe 64 may be bent in a particular configuration as exemplarily shown in FIG 9. Further, referring to FIGS. 8A and 8C, in one or more embodiments of the present invention, the end of the magneto-hydrodynamic pipe 64 not housed in the pump assembly 76 may be sealed by a cap 84.

As indicated by the arrows shown in FIGS. 8B and 8C, (i) fluid directed away from a hot spot of an integrated circuit (not shown) is carried up by pipe 80, and (ii) fluid directed toward the hot spot is carried down along the sides of pipe 82 around the outside surface of pipe 80. Those skilled in the art will note that the fluid carried by pipes 80, 82 may be thermally conductive so as to be capable of transferring heat away from a corresponding hot spot of an integrated circuit. Further, in one or more embodiments of the present invention, the pipes 80, 82 themselves may be formed of a thermally conductive material. For example, the pipes 80, 82 may be formed of copper.

FIG. 10A shows an example of a portion of the pump assembly 76 in accordance with an embodiment of the present invention. The inner pipe (not shown) is affixed to a plastic ring 92. Along an inner surface of the plastic ring 92 are disposed two electrical conductors 88. In one or more embodiments of the present invention, the electrical conductors 88 may be formed of copper.

Along an outer surface of the plastic ring 92 are disposed two magnets 86. Those skilled in the art will note that in one or more other embodiments of the present invention, a different arrangement and/or amount of magnets than that shown in FIG. 10A may be used.

Further, the portion of the pump assembly 76 shown in FIG. 10A may be housed in a ferromagnetic metal piece 90 as shown in FIG. 10B. The ferromagnetic metal piece 90 may be used to at least partially house a magnetic field induced between the magnets 86 as described below with reference to FIGS. 11A, 11B, and 11C. In one or more embodiments of the present invention, the ferromagnetic metal piece 90 may be formed of, for example, iron, nickel, and/or cobalt. Further still, as shown in FIG. 10A, in one or more embodiments of the present invention, the pump assembly 76 may be cylindrical in shape.

Figure 11A:
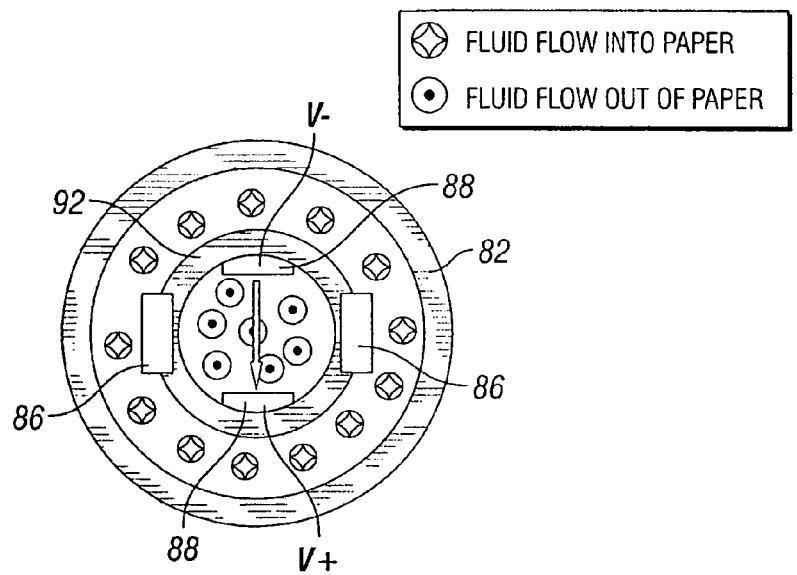
FIG. 11A shows a portion of a heat sink in accordance with an embodiment of the present invention.
Figure 11B:
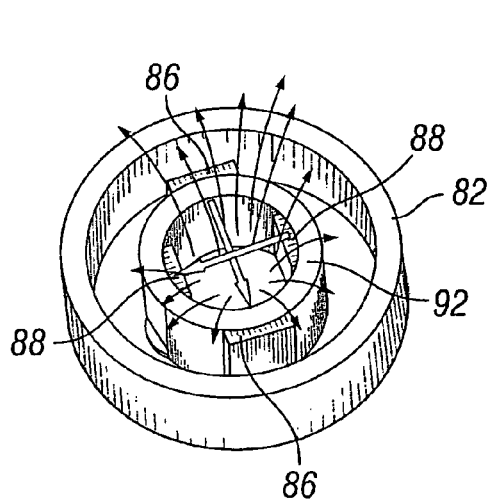
FIG. 11B shows a portion of a heat sink in accordance with an embodiment of the present invention.
Figure 11C:
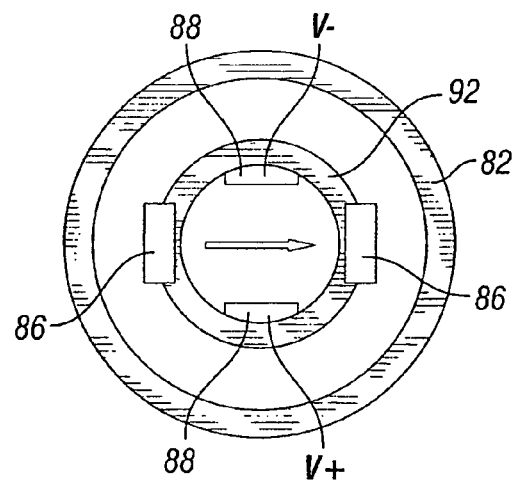
FIG. 11C shows a portion of a heat sink in accordance with an embodiment of the present invention.

FIGS. 11A, 11B, and 11C shows portions of the pump assembly 76 in accordance with one or more embodiments of the present invention. As shown in FIG. 11A, voltages are applied on each of the electrical conductors 88 so as to result in a voltage potential difference between the two electrical conductors 88. The resulting voltage potential difference induces current flow from the higher voltage electrical conductor 88 to the lower voltage electrical conductor 88 (direction of induced current flow shown by the arrow in FIG. 11A). Because fluid flowing in the magneto-hydrodynamic pipe 64 may be electrically conductive, the induced electrical current in a magnetic field induced between magnets 86 determines the flow of fluid, where an example of an induced magnetic field between magnets 86 is shown in FIG. 11C. For example, as shown in FIGS. 11A and 11B, fluid in an inner pipe flows out from a surface of the sheet showing FIG. 11A, and fluid in an outer pipe flows into a surface of the sheet showing FIG. 11A. Those skilled in the art will note that in one or more other embodiments of the present invention, the flow of fluid may be reversed by reversing one of the polarities of the magnets 86 or a direction of the electrical current induced between electrical conductors 88. Further, in one or more embodiments of the present invention, the rate of fluid flow may be adjusted by adjustments to the magnets 86 and/or the voltages applied to the electrical conductors 88.

As described above, a magneto-hydrodynamic pipe in a heat sink in accordance with one or more embodiments of the present invention has an end that is associated with a temperature sensor on a lid disposed over an integrated circuit. By using the temperature readings taken by the temperature sensor, a pump assembly of the magneto-hydrodynamic pipe may be adjusted so as to effectuate a desired response with respect to hot spot cooling.

Figure 12:
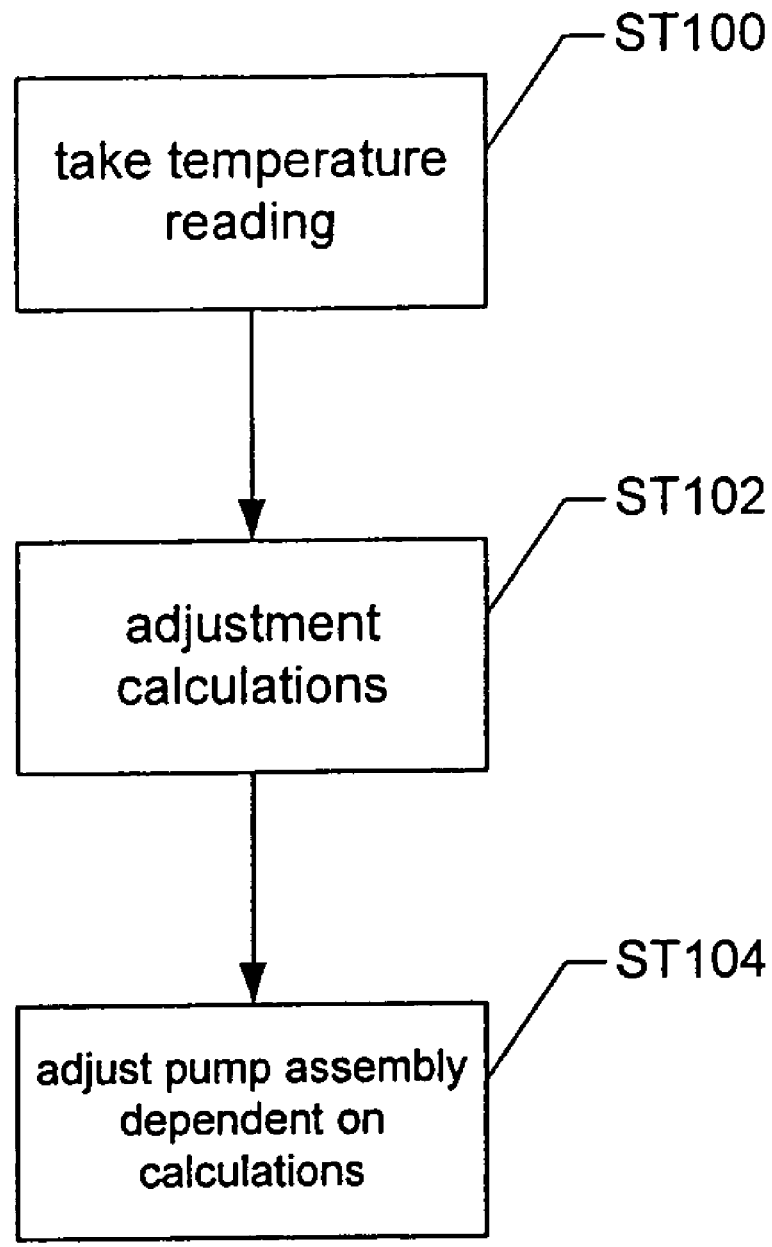
FIG. 12 shows a flow process in accordance with an embodiment of the present invention.

FIG. 12 shows an example of a flow process in accordance with an embodiment of the present invention. In FIG. 12, a temperature sensor is used to take a temperature reading at a location of an integrated circuit ST100. The temperature reading may be transmitted to, for example, a control module that calculates certain adjustments based on the temperature reading ST102. The adjustments may be made in reliance on assuming that ambient air flow conditions and/or heat sink parameters remain constant. In such a manner, the parameters associated with a pump assembly of a magneto-hydrodynamic pipe may be adjusted without being dependent on varying ambient or heat sink conditions.

In ST104, adjustments to the pump assembly of the magneto-hydrodynamic pipe are made based on the calculations in ST102. These adjustments may involve, for example, adjusting an induced electrical current in the pump assembly. In such a manner, the rate of fluid flow may be adjusted so as to more quickly or more slowly dissipate heat away from a corresponding hot spot.

Those skilled in the art will note that the control module may be any device or medium usable to make adjustment calculations. For example, the control module may be part of another integrated circuit or may be a software module executable by the integrated circuit being cooled.

Advantages of the present invention may include one or more of the following. In one or more embodiments of the present invention, one or more hot spots of an integrated circuit may be cooled dependent on a feedback response based on a current temperature at the one or more hot spots.

In one or more embodiments of the present invention, a flow of thermally conductive fluid used to cool one or more hot spots of an integrated circuit may be controlled so as to effectuate a desired level of cooling.

In one or more embodiments of the present invention, a pump assembly for driving the flow of fluid used to cool one or more hot spots of an integrated circuit resides outside of a body of the a heat sink, thereby exposing the pump assembly to air that is cooler than that flowing within the body of the heat sink.

In one or more embodiments of the present invention, a magnetic field used to drive the flow of fluid used to cool one or more hot spots of an integrated circuit may be shielded so as to prevent magnetic field interference.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
   an integrated circuit;
   a lid disposed over the integrated circuit;
   a temperature sensor disposed on the lid and arranged to measure a temperature of a hot spot of the integrated circuit; and
   a heat sink operatively connected to the lid, the heat sink comprising:
      a pipe operatively connected to the temperature sensor, and
      a pump assembly operatively connected to the pipe and arranged to generate a magnetic field, wherein fluid flow within the pipe is dependent on the magnetic field and the temperature sensor.

2. The computer system of claim 1, the pump assembly comprising:
   at least two magnets, wherein the magnetic field is induced between the at least two magnets.

3. The computer system of claim 1, the pump assembly comprising:
   a first electrical conductor; and
   a second electrical conductor,
   wherein fluid flow within the pipe is dependent on an electrical current induced between the first electrical conductor and the second electrical conductor.

4. The computer system of claim 3, wherein the induced electrical current is dependent on the temperature sensor.

5. The computer system of claim 1, the pipe comprising:
   a first pipe; and
   a second pipe inside and concentric with the first pipe.

6. The computer system of claim 5, wherein fluid flow in the first pipe and outside the second pipe is one of away from and toward the hot spot, and wherein fluid flow in the second pipe is the other of the one of away from and toward the hot spot.

7. The computer system of claim 1, further comprising:
   a ferromagnetic metal piece arranged to at least partially shield the magnetic field.

8. The computer system of claim 1, wherein the pump assembly is disposed outside a body of the heat sink.

9. The computer system of claim 1, the pump assembly comprising:
   a plastic ring, wherein at least one electrical conductor is disposed along a surface of the plastic ring, and wherein at least one magnet is disposed along a surface of the plastic ring.

10. The computer system of claim 1, wherein the pump assembly is cylindrical in shape.

11. The computer system of claim 1, wherein the fluid is at least one of thermally and electrically conductive.

12. The computer system of claim 1, wherein the lid comprises a recess arranged to at least partially house the integrated circuit.

13. A heat sink, comprising:
   a body having a plurality of fins configured to dissipate heat;
   a pipe extending through the body and arranged to propagate electrically and thermally conductive fluid, wherein the pipe is further adapted to cool a hot spot of an integrated circuit; and
   a pump assembly operatively connected to the pipe and arranged to generate a magnetic field and an electrical current, wherein fluid flow within the pipe is dependent on the magnetic field and a temperature of the hot spot.

14. The heat sink of claim 13, wherein a value of the electrical current is dependent on the temperature.

15. The heat sink of claim 13, the pipe comprising:
   an interior pipe concentric with the pipe, wherein fluid flow in the pipe and outside of the interior pipe is opposite to fluid flow in the interior pipe.

16. The heat sink of claim 13, further comprising:
   a ferromagnetic metal piece arranged to at least partially shield the magnetic field.

17. The heat sink of claim 13, wherein the pump assembly is disposed outside the body.

* * * * *